United States Patent
Lin

(10) Patent No.: US 10,424,364 B1
(45) Date of Patent: Sep. 24, 2019

(54) MEMORY DEVICE AND CONTROL METHOD THEREOF

(71) Applicant: Winbond Electronics Corp., Taichung (TW)

(72) Inventor: Chih-Feng Lin, Zhubei (TW)

(73) Assignee: Winbond Electronics Corp., Taichung (TW)

(*) Notice: Subject to any disclaimer, the term of this patent is extended or adjusted under 35 U.S.C. 154(b) by 0 days.

(21) Appl. No.: 16/144,172

(22) Filed: Sep. 27, 2018

(51) Int. Cl.
- *G11C 11/406* (2006.01)
- *G11C 5/14* (2006.01)
- *G11C 11/408* (2006.01)

(52) U.S. Cl.
CPC ........ *G11C 11/40615* (2013.01); *G11C 5/145* (2013.01); *G11C 11/4087* (2013.01); *G11C 11/4085* (2013.01); *G11C 2211/4067* (2013.01); *G11C 2211/4068* (2013.01)

(58) Field of Classification Search
CPC .............. G11C 11/40615; G11C 5/145; G11C 11/4087
See application file for complete search history.

(56) References Cited

U.S. PATENT DOCUMENTS

| | | | |
|---|---|---|---|
| 6,434,076 B1 | 8/2002 | Anderson et al. | |
| 6,909,660 B2 | 6/2005 | Oh | |
| 8,233,347 B2 * | 7/2012 | Nakamura | G11C 5/145 365/189.09 |
| 8,743,649 B2 * | 6/2014 | Sato | G11C 5/14 365/185.23 |
| 9,396,784 B2 * | 7/2016 | Cox | G11C 11/40611 |
| 2007/0081366 A1 * | 4/2007 | Stahl | H02M 3/07 363/59 |
| 2014/0321226 A1 | 10/2014 | Pyeon | |

FOREIGN PATENT DOCUMENTS

TW          I239015 B     9/2005

* cited by examiner

*Primary Examiner* — Tri M Hoang
(74) *Attorney, Agent, or Firm* — Muncy, Geissler, Olds & Lowe, P.C.

(57) ABSTRACT

A memory device includes a memory array, a switch device, and a controller. The switch device is arranged between a first voltage node and a second voltage node. The second voltage node is connected to the memory array. The controller is enabled to output a refresh mode signal, a refresh trigger signal, and a pre-start up signal. The memory device enters a self-refresh mode in response to the refresh mode signal. The memory device performs a self-refresh on the memory array in the self-refresh mode. In self-refresh mode, the controller outputs the pre-start up signal first prior to the refresh trigger signal to enable the switch device, so that the voltage of the second voltage node is increased to the voltage of the first voltage mode.

12 Claims, 4 Drawing Sheets

MEMORY DEVICE AND CONTROL METHOD THEREOF

FIELD OF THE INVENTION

The invention relates in general to a memory device, and it relates in particular to a control method for a memory device to enter a self-refresh mode.

DESCRIPTION OF THE RELATED ART

Recently, dynamic random access memory (DRAM) is being used in a variety of electronic devices. DRAM is a volatile memory. In other words, DRAM may lose its storage status after the power to the memory is turned off. Data that is stored in a DRAM may gradually decay or become invalid due to the effects of internal leakage current. In order to maintain the validity of internal data, a DRAM needs to refresh its internal data bits periodically.

When a DRAM operates in a self-refresh mode, the DRAM is idle for most of the operation time. FIG. 1 shows a diagram of an internal leakage current path in a memory device. As shown in FIG. 1, the memory device 100 comprises a decoder 102 powered by a positive power VP and a negative power VN. The decoder 102 is connected to the gate of a transistor 110 via a word line 104. The transistor 110 connects the bit line 106 to the storage unit capacitor 108. The storage unit capacitor 108 connects the transistor 110 to a buried plate voltage (VPL).

Since the positive power VP has high voltage, there is a leakage current that flows from the positive power VP to the negative power VN through the decoder 102 even if the memory device 100 is not under operation, and the leakage current is still continuously present. A method for saving power is first to lower down a voltage of the positive power VP before the memory device 100 entering the self-refresh mode. Although the method described above can decrease the leakage current that passing through a leakage current path 112. However, if the voltage of the positive power VP cannot revert back to the original voltage level in waiting time tXSR, once the memory device 100 receives instructions from external devices for operation, the voltage of the positive power VP does not reach the normal operating voltage of the memory device 100, and the memory device 100 may fall into an error.

BRIEF SUMMARY OF THE INVENTION

In order to reduce the leakage current coming from inside the original memory device 100 so that it does not interfere with its operation, the present invention provides a new architecture that includes a switch device to separate the positive power VP inside a memory array from the positive power VP outside the memory array. The switch device also operates to step down the voltage of the positive power VP and the pre-start up mechanism to recover the positive power VP inside the memory array.

In more detail, an embodiment of the invention discloses a memory device that comprises a memory array, a switch device, and a controller. The switch device is arranged between a first voltage node and a second voltage node. The second voltage node is coupled to the memory array. The controller is able to output a refresh mode signal, a refresh trigger signal, and a pre-start up signal. The memory device enters a self-refresh mode in response to the refresh mode signal. In the self-refresh mode, the memory device self-refreshes the memory array in response to the refresh trigger signal. In the self-refresh mode, after the memory device performs a self-refresh, the controller outputs the pre-start up signal first before outputting the refresh trigger signal again, and the switch device is turned on in response to the pre-start up signal, so that the voltage level of the second voltage node is increased to the voltage level of the first voltage node.

An embodiment of the invention discloses a control method for a memory device, wherein the memory device includes a memory array, a switch device, and a controller. The switch device is arranged between a first voltage node and a second voltage node. The controller is able to output a refresh mode signal, a refresh trigger signal, and a pre-start up signal. The memory device enters a self-refresh mode in response to the refresh mode signal. According to the control method, in the self-refresh mode after the memory device has performed a self-refresh, the controller outputs the pre-start up signal again and causes the switch device to turn on. This is done so that the voltage level of the second voltage node is increased to the voltage level of the first voltage node. After that, the controller outputs a refresh trigger signal, so that the memory device self-refreshes the memory array.

BRIEF DESCRIPTION OF THE DRAWINGS

The invention can be more fully understood by reading the subsequent detailed description with references made to the accompanying figures. It should be understood that the figures are not drawn to scale in accordance with standard practice in the industry. In fact, it is allowed to arbitrarily enlarge or reduce the size of components for clear illustration.

DETAILED DESCRIPTION OF THE INVENTION

Figure 2:
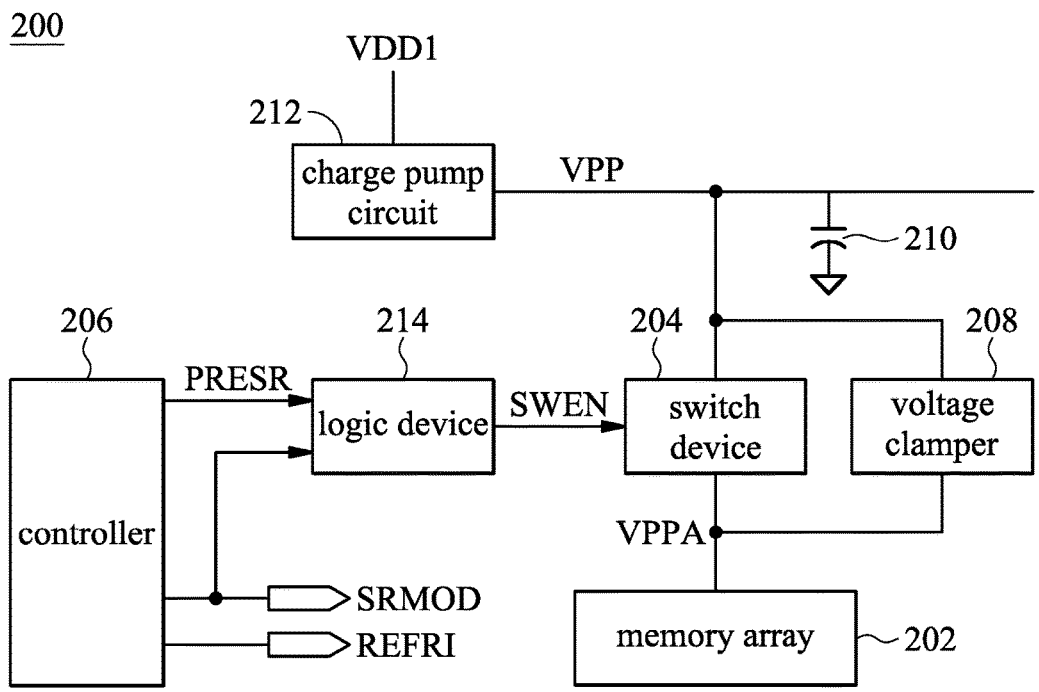
FIG. 2 is a block diagram of a memory device in accordance with an embodiment of a disclosure.

FIG. 2 is a block diagram of a memory device in accordance with an embodiment of a disclosure. As shown in FIG. 2, the memory device 200 comprises a memory array 202, a switch device 204, a controller 206, a voltage damper 208, a decoupling capacitor 210, a charge pump circuit 212, and a logic device 214. The memory array 202 includes a plurality of memory cells which are used to store bit data. The memory device 200 further includes a column decoder, a row decoder, and a sequence control circuit, none of which is illustrated in FIG. 2. When the memory device 200 is in a self-refresh mode, the column decoder, the row decoder, and the sequence control circuit may perform a self-refresh on the memory array 202 in accordance with a refresh trigger signal REFRI output by the controller 206. The memory array 202 can also be presented in the form of a memory bank. The switch device 204 is arranged between a first voltage node VPP and a second voltage node VPPA, and the second voltage node VPPA is connected to the memory array 202. The second voltage node VPPA is connected to the memory array 202, for example, by supplying power to the column decoder and/or the row decoder, etc.

The controller 206 is configured to output a refresh mode signal SRMOD, the refresh trigger signal REFRI, and a pre-start up signal PRESR. The memory device 200 enters the self-refresh mode in response to a refresh mode signal which is output by the controller 206. In the self-refresh mode, the memory device 200 performs a self-refresh on the memory array 202 in response to the refresh trigger signal REFRI. The logic device 214 is configured to control the switch device 204 in accordance with both the refresh mode signal SRMOD and the pre-start up signal PRESR which are output by the controller 206. In the self-refresh mode, if the logic device 214 does not receive the pre-start up signal PRESR, then the logic device 214 turns off the switch device 204. In the self-refresh mode, after the controller 206 outputs the refresh trigger signal REFRI and the memory device performs a self-refresh, the controller 206 may first output the pre-start up signal PRESR before outputting the refresh trigger signal REFRI again, so that the voltage level of the second voltage node is increased toward the voltage level of the first voltage node. When the controller 206 stops outputting the refresh mode signal SRMOD and the memory device 200 leaves the self-refresh mode, the logic device 214 turns on the switch device 204 so that the memory array 202 is able to be read and written.

The voltage damper 208 is arranged between the first voltage node VPP and the second voltage node VPPA. When the switch device 204 is turned off, the voltage damper 208 is able to maintain the voltage level of the second voltage node to be higher than a reference voltage. The decoupling capacitor 210 connects the first voltage node VPP to a ground. When the switch device 204 is turned on, the decoupling capacitor 210 is able to recover the voltage level of the first voltage node VPP quickly. The charge pump circuit 212 connects the power voltage VDD1 to the first voltage node VPP. When the switch device 204 is turned on, the charge pump circuit 212 is able to pull up the voltage level of the first voltage node VPP to a rated voltage.

Figure 3:
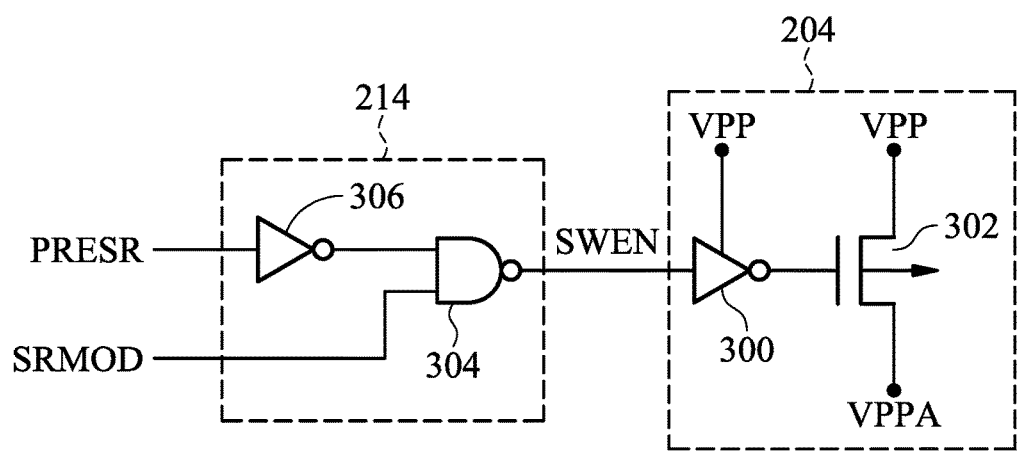
FIG. 3 is a schematic diagram of a switch device and a logic device in FIG. 2 in accordance with the embodiment of the disclosure.

FIG. 3 shows a schematic of a switch device and a logic device in FIG. 2 in accordance with the embodiment of the disclosure. In the embodiment shown in FIG. 3, the switch device 204 includes, for example, an inverter 300 and a PMOS transistor 302, wherein the PMOS transistor 302 connects the first voltage node VPP to the second voltage node VPPA. The gate of the PMOS transistor 302 is connected to the output terminal of the inverter 300. The input terminal of the inverter 300 receives a control signal SWEN from the logic device 214. In the embodiment, the logic device 214 includes, for example, a NAND gate 304 and an inverter 306, wherein the first input terminal of the NAND gate 304 is connected to the output terminal of the inverter 306. The input terminal of the inverter 306 receives the pre-start up signal PRESR from the controller 206. A second input terminal of the NAND gate 304 receives the refresh mode signal SRMOD from the controller 206. An output terminal of the NAND gate 304 (that is, the output terminal of the logic device 214) is connected to the switch device 204 so that the logic device 214 is able to turn the switch device 204 on and off.

Figure 4:
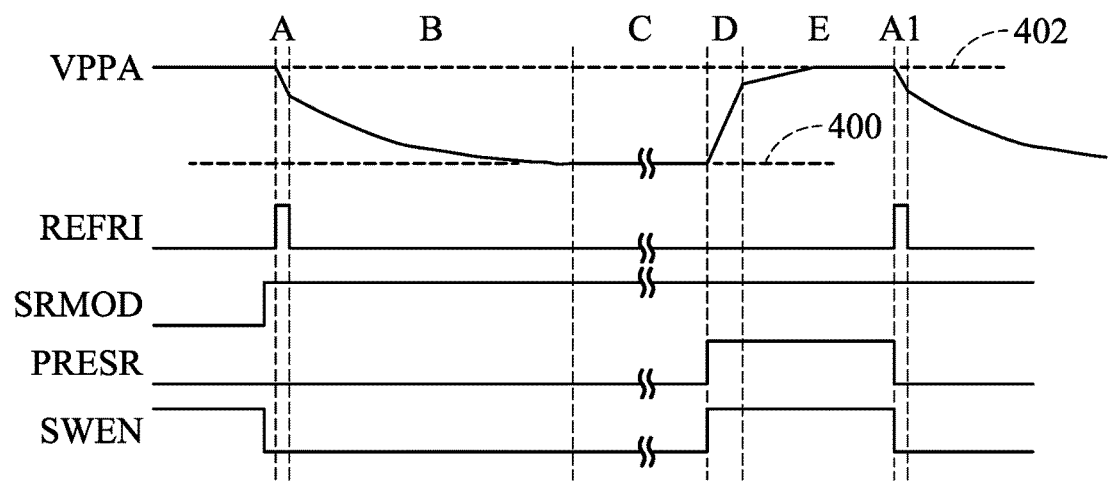
FIG. 4 is a sequence diagram showing the associated waveform relationship between a second voltage node VPPA and a plurality of control signals in FIG. 2 in accordance with the embodiment of the disclosure.

FIG. 4 is a sequence diagram showing the associated waveform relationship between a second voltage node VPPA and a plurality of control signals in FIG. 2 in accordance with the embodiment of the disclosure. According to FIG. 4, before the controller 206 outputs the refresh mode signal SRMOD, the refresh mode signal SRMOD is at a logic low level. Meanwhile, because the pre-start up signal PRESR is also at a logic low level, the logic device 214 outputs the control signal SWEN with a logic high level in accordance with the logic circuit of the logic device 214 in FIG. 3. The control signal SWEN becomes a logic low level after passing through the inverter 300 in the switch device 204, so that the PMOS transistor 302 is turned on: That is, the switch device 204 is also turned on.

Figure 1:
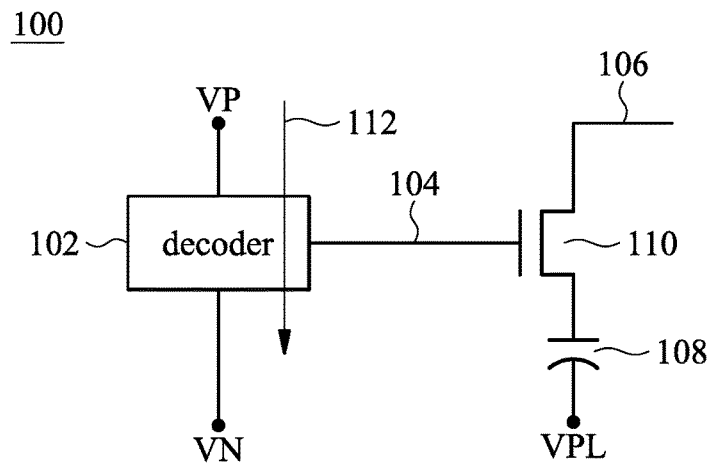
FIG. 1 is a schematic diagram of an internal leakage current path in a memory device.

After the controller 206 outputs the refresh mode signal SRMOD, the memory device 200 enters the self-refresh mode. At this time, because the refresh mode signal SRMOD is changing from a logic low level to a logic high level, the pre-start up signal PRESR is still at a logic low level, so that the control signal SWEN which is output from the logic device 214 becomes a logic low level, the switch device 204 is turned off, and the electrical connection between the first voltage node VPP and the second voltage node VPPA is therefore cut off. Then, in the self-refresh mode, the controller 206 outputs a refresh trigger signal REFRI so that the memory array 202 may start to perform a self-refresh (in a time period A). After time period A, due to leakage current in the memory array 202 (such as the leakage current path 112 shown in FIG. 1), the voltage level of the second voltage node VPPA decreases gradually until the voltage damper 208 clamps the voltage level of the second voltage node VPPA at the reference voltage 400 (in time periods B and C).

Then, in the self-refresh mode, the controller outputs the pre-start up signal PRESR (becoming a logic high level), and at this time, because the refresh mode signal SRMOD has become a logic high level, the control signal SWEN, which was output by the NAND gate 304 in the logic device 214, becomes a logic high level, so that the PMOS transistor 302 in the switch device 204 is turned on. Because the voltage level of the decoupling capacitor 210 is equal to that of the first voltage node VPP here, the voltage level of the second voltage node VPPA can be increased to the voltage level of the first voltage node VPP (in time period D). Then, the charge pump circuit 212 is enabled by detecting that the voltage level of the first voltage node VPP has not reached the rated voltage 402 for operation of the memory device 200, and it pulls up the voltage level of both the first voltage node VPP and the second voltage node VPPA to the rated voltage 402 (between time periods D and E).

After the voltage of the second voltage node VPPA reaches the rated voltage 402 in time period A1, controller 206 outputs a refresh trigger signal REFRI again and stops outputting the pre-start up signal PRESR. Because the pre-start up signal PRESR changes from logic high level to logic low level, the corresponding control signal SWEN also changes from a logic high level to a logic low level, so that the switch device 204 is turned off, and the memory array 202 starts to perform the next cycle of self-refresh (in time period A1). Because the length of time periods B and C, when the memory array 202 performs a self-refresh, is 95% of the self-refresh cycle time (that is, during time periods B and C the memory array 202 is in an idle mode), the memory device and control method thereof disclosed in the present invention can effectively decrease the leakage current (such as the leakage current path 112 in FIG. 1) and save power.

In order to ensure that the self-refresh that starts in time period A1 can be completed correctly, before the controller 206 outputs the refresh trigger signal REFRI again in time period A1, the controller 206 first outputs the pre-start up signal PRESR and turns on the switch device 204 so that the voltage level of the second voltage node VPPA can recover quickly.

Figure 5:
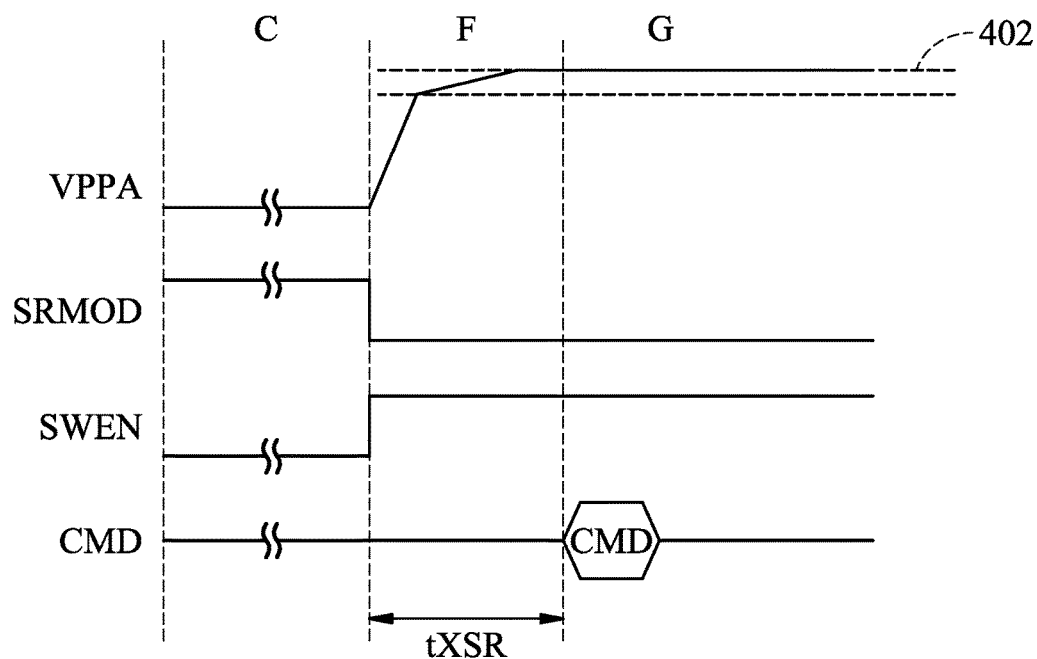
FIG. 5 is a sequence diagram showing the associated waveform relationship between the second voltage node VPPA and the plurality of control signals after the memory device leaves the self-refresh mode in FIG. 2, in accordance with the embodiment of the disclosure.

FIG. 5 is a sequence diagram showing the waveform relationship between the second voltage node VPPA and the plurality of control signals after the memory device leaves the self-refresh mode in FIG. 2, in accordance with the embodiment of the disclosure. As shown in FIG. 5, when the memory device 200 needs to leave the self-refresh mode and perform general read and write operations, the controller 206 may first output the refresh mode signal SRMOD (from time period C to time period F in FIG. 5), so that the memory device 200 can leave the self-refresh mode and enter a normal operation mode. At this time, because the refresh mode signal SRMOD becomes logic low level, so that the control signal SWEN which is output by the NAND gate 304 in the logic device 214 becomes a logic high level, and the PMOS transistor 302 in the switch device 204 is turned on. At this time, the voltage level of the decoupling capacitor 210 is the same as that of the first voltage node VPP, so that the voltage level of the second voltage node is increased to the voltage level of the first voltage node (the first line with a larger slope in time period F). Then, the charge pump circuit 212 is enabled by detecting that the voltage level of the first voltage node VPP has not reached the rated voltage 402 for operation of the memory device 200, and it pulls up the voltage level of both the first voltage node VPP and the second voltage node VPPA to the rated voltage 402 (the second line with a smaller slope in time period F and the third horizontal line in time period G). After the voltage of the second voltage node VPPA reaches the rated voltage 402 (That is, after the voltage of the second voltage node VPPA reaches the operating voltage of the memory device 200), the memory array 202 receives an instruction signal CMD output by the controller 206 and starts to perform read and write operations (in time period G). In time period F, it is necessary to wait for the voltage level of the second voltage node VPPA to revert back to the rated voltage 402, and thus the controller 206 outputs the instruction signal CMD right after waiting time tXSR to prevent the lower operating voltage to cause an error in the memory array 202.

Figure 6:
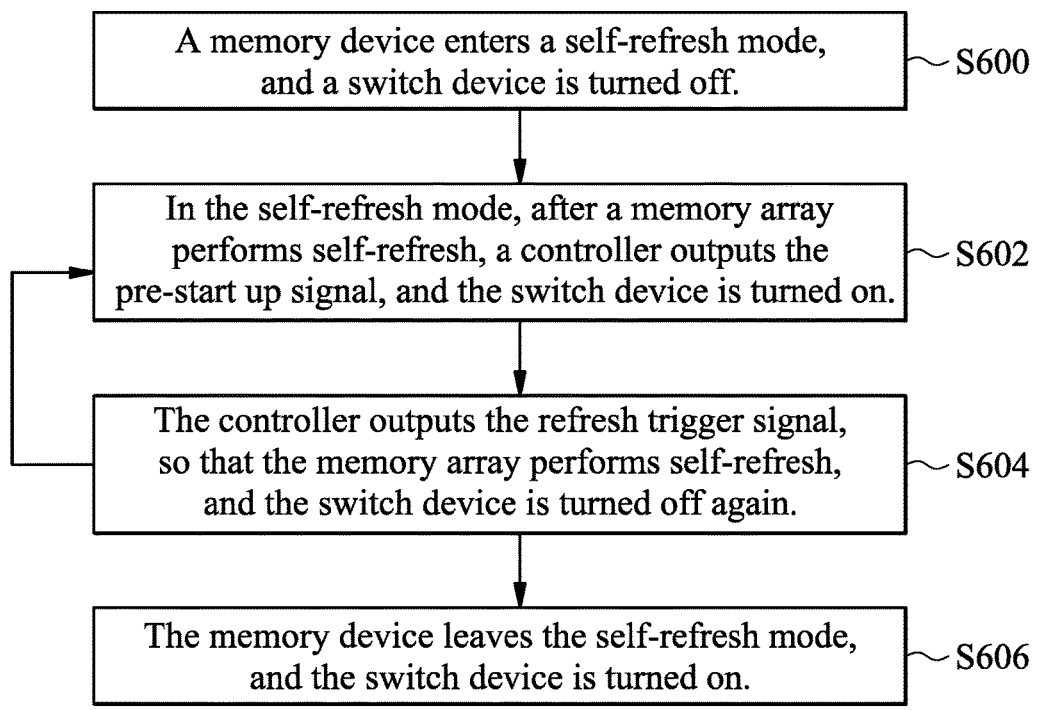
FIG. 6 is a control flow chart of the memory device in FIG. 2 in accordance with the embodiment of the disclosure.

FIG. 6 is a control flow chart of the memory device in FIG. 2 in accordance with the embodiment of the disclosure. The memory device 200 enters the self-refresh mode after receiving the refresh mode signal SRMOD from the controller 206, and the switch device 204 is turned off (S600). S600 is for cutting off an electrical connection between the first voltage node VPP and the second voltage node VPPA, and the voltage level of the second voltage node VPPA decreases gradually due to the leakage current in the memory array 202. In the self-refresh mode, after the memory array 202 performs a self-refresh, the controller 206 outputs the pre-start up signal PRESR, and the switch device 204 is turned on (S602). In S602, the voltage level of the second voltage node VPPA is increased to the voltage level of the first voltage node VPP, and with the operation of the charge pump circuit 212, a front work (the voltage level of the first voltage node can reach the rated voltage 402) can be finished before the memory array 202 performs a self-refresh. This avoids a refresh error in the memory array 202 caused by the lower voltage level of the first voltage node VPP. Then, the controller 206 outputs the refresh trigger signal REFRI, so that the memory array 202 performs a self-refresh, and the switch device 204 is turned off again (S604). The memory array 202 is in an idle mode during most of the self-refresh cycle of the memory array 202, and thus the switch device 204 is turned off for decreasing the leakage current in step S604. If the memory device 200 needs to perform another cycle of self-refresh, the controller 206 outputs the refresh trigger signal REFRI again. In other words, the method reverts from step S604 back to step S602. If the memory device 200 needs to leave the self-refresh mode, the controller 206 stops outputting the refresh mode signal SRMOD so that the memory device 200 leaves the self-refresh mode, and the switch device 204 is turned on (S606). In step S606, the voltage level of the second voltage node VPPA can be pulled up to the rated voltage 402, so that the memory device 200 can perform normal read and write commands under sufficient operating voltage.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term). In the specification of the present invention, the word "couple" refers to any kind of direct or indirect electronic connection. The present invention is disclosed in the preferred embodiments as described above, however, the breadth and scope of the present invention should not be limited by any of the embodiments described above. Persons skilled in the art can make small changes and retouches without departing from the spirit and scope of the invention. The scope of the invention should be defined in accordance with the following claims and their equivalents.

What is claimed is:

1. A memory device, comprising:
   a memory array;
   a switch device, arranged between a first voltage node and a second voltage node, wherein the second voltage node is coupled to the memory array; and
   a controller, configured to output a refresh mode signal, a refresh trigger signal, and a pre-start up signal;
   wherein the memory device enters a self-refresh mode in response to the refresh mode signal;
   in the self-refresh mode, the memory device performs a self-refresh on the memory array in response to the refresh trigger signal;
   in the self-refresh mode, after the memory device performs a self-refresh, the controller outputs the pre-start up signal first before outputting the refresh trigger signal again, and the switch device is turned on in response to the pre-start up signal, so that a voltage level of the second voltage node is increased toward a voltage level of the first voltage node.

2. The memory device as claimed in claim 1, further comprising a voltage damper arranged between the first voltage node and the second voltage node, wherein the voltage clamper maintains the voltage level of the second voltage node to be higher than a reference voltage.

3. The memory device as claimed in claim 1, further comprising a decoupling capacitor coupled between the first voltage node and a ground, wherein when the switch device is turned on, the decoupling capacitor operates to quickly recover the voltage level of the first voltage node.

4. The memory device as claimed in claim 1, further comprising a charge pump circuit and an output terminal of the charge pump circuit coupled to the first voltage node, wherein when the switch device is turned on, the charge pump circuit operates to pull up the voltage level of the first voltage node to a rated voltage.

5. The memory device as claimed in claim 1, further comprising a logic device which is configured to control the switch device in accordance with the refresh mode signal and the pre-start up signal from the controller.

6. The memory device as claimed in claim 5, wherein when the controller stops outputting the refresh mode signal and makes the memory device leave the self-refresh mode, the logic device controls the switch device to turn on.

7. A control method of a memory device, wherein the memory device includes a memory array, a switch device arranged between a first voltage node and a second voltage node which is coupled to the memory array, a controller which is configured to output a refresh mode signal, a refresh trigger signal, and a pre-start up signal, wherein the memory device enters a self-refresh mode in response to the refresh mode signal, the control method comprising:

in the self-refresh mode after the memory device has performed a self-refresh, the controller outputs the pre-start up signal again, making the switch device turn on so that the voltage level of the second voltage node is increased toward the voltage level of the first voltage node; after that, the controller outputs a refresh trigger signal so that the memory device performs a self-refresh on the memory array.

8. The control method of the memory device as claimed in claim 7, further comprising:

using a voltage damper arranged between the first voltage node and the second voltage node to keep the voltage level of the second voltage node higher than a reference voltage when the switch device is turned off.

9. The control method of the memory device as claimed in claim 7, further comprising:

using a decoupling capacitor coupled between the first voltage node and a ground to quickly recover the voltage level of the first voltage node when the switch device is turned on.

10. The control method of the memory device as claimed in claim 7, further comprising:

using a charge pump circuit having a first output terminal coupled to the first voltage node to pull up the voltage of the first voltage mode to a rated voltage when the switch device is turned on.

11. The control method of the memory device as claimed in claim 7, further comprising:

using a logic device to control the switch device in accordance with the refresh mode signal and the pre-start up signal from the controller.

12. The control method of the memory device as claimed in claim 11, wherein when the controller stops outputting the refresh mode signal and makes the memory device leave the self-refresh mode, the logic device controls the switch device to turn on.

* * * * *